(12) United States Patent
Prajuckamol et al.

(10) Patent No.: US 12,721,168 B2
(45) Date of Patent: Aug. 25, 2026

(54) DIRECT SUBSTRATE-SIDE COOLING IN POWER DEVICE MODULE

(71) Applicant: SEMICONDUCTOR COMPONENTS INDUSTRIES, LLC, Phoenix, AZ (US)

(72) Inventors: Atapol Prajuckamol, Thanyaburi (TH); Chee Hiong Chew, Seremban (MY); Yushuang Yao, Shenzhen (CN)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 868 days.

(21) Appl. No.: 17/814,949

(22) Filed: Jul. 26, 2022

(65) Prior Publication Data

US 2024/0038632 A1 Feb. 1, 2024

(51) Int. Cl.

| | |
|---|---|
| ***H10W 40/47*** | (2026.01) |
| ***H10W 40/25*** | (2026.01) |
| ***H10W 90/00*** | (2026.01) |
| ***H10W 99/00*** | (2026.01) |

(52) U.S. Cl.

CPC ......... *H10W 40/47* (2026.01); *H10W 40/255* (2026.01); *H10W 90/00* (2026.01); *H10W 99/00* (2026.01); *H10W 90/765* (2026.01)

(58) Field of Classification Search

None

See application file for complete search history.

(56) References Cited

U.S. PATENT DOCUMENTS

2007/0057248 A1 3/2007 Yao et al.
2009/0057882 A1 3/2009 Gerbsch
2010/0230800 A1* 9/2010 Beaupre ................ H01L 23/473 257/691
2013/0020694 A1* 1/2013 Liang .................... H01L 23/473 257/691
2014/0185243 A1* 7/2014 Joo .................... H05K 7/20927 361/709
2020/0176354 A1* 6/2020 Matsuzawa ............. H01L 24/33
2020/0388557 A1* 12/2020 Yoo ..................... H01L 23/3735
2023/0395464 A1* 12/2023 Du ........................ H01L 23/473

* cited by examiner

*Primary Examiner* — Sue A Purvis
*Assistant Examiner* — Jordan M Klein
(74) *Attorney, Agent, or Firm* — Brake Hughes Bellermann LLP

(57) ABSTRACT

A method includes disposing at least one power device between a first direct bonded metal (DBM) substrate and a second DMB substrate and thermally coupling a plurality of pipes to a top side of the first DBM substrate opposite a side of the first DBM substrate with the at least one power device. The plurality of pipes is configured to carry cooling fluids in thermal contact with the first DBM substrate.

21 Claims, 11 Drawing Sheets

100

200

400

400

Y
Z
440
41s
42s
71
72
222
422
148
148
30b
30a
21a
21b
21c
T
21
B
220
420
510
500

Disposing at least one power device between a first direct bonded metal (DBM) substrate and a strip of conductive material
610
Thermally coupling at least one pipe to a top side of the strip of conductive material
620
600

DIRECT SUBSTRATE-SIDE COOLING IN POWER DEVICE MODULE

FIELD OF THE DISCLOSURE

The present disclosure relates to electronic power device modules and more specifically to power device modules that include features for thermal management.

BACKGROUND

Modern high-power devices can be fabricated using advanced silicon technology to meet high power requirements. High-power devices that can deliver or switch high levels of power can be used in, for example, vehicles powered by electricity (e.g., Electric vehicles (EVs), hybrid electric vehicles (HEVs) and plug-in-electric vehicles (PHEV)). In some instances, device die of the high-power devices (e.g., silicon power devices such as an insulated-gate bipolar transistor (IGBT), a fast recovery diode (FRD), a silicon carbide metal-oxide-semiconductor field-effect transistor (SiC MOSFET), (etc.) may be disposed on a single direct bonded copper (DBC) substrate in a single-side cooling (SSC) power device module. In other instances, the device die are attached to spacer blocks and disposed between a pair of DBC substrates in a dual-side cooling (DSC) power device module. Heat generated by the device die in the modules is dissipated through the outer copper layer of the DBC substrate(s). Some modern power applications (e.g., automotive applications) have increasing power demands that can cause the devices in the power device modules to generate more heat than in earlier applications. Additional cooling mechanisms are needed to dissipate the heat generated by the devices in a power device module for the modern power applications.

SUMMARY

In a general aspect, a package includes at least one power device disposed between a first direct bonded metal (DBM) substrate and a second DBM substrate, and at least one pipe thermally coupled to a top side of the first DBM substrate opposite a side of the first DBM substrate with the at least one power device. The at least one pipe is configured to include a cooling fluid therein.

In a general aspect, a power device module includes at least one power device disposed between a direct bonded metal (DBM) substrate and a conductive strip of material, and at least one pipe thermally coupled to a top side of the conductive strip of material. The at least one pipe is configured to include a cooling fluid.

In a general aspect, a method includes disposing at least one power device between a first direct bonded metal (DBM) substrate and a strip of conductive material, and thermally coupling at least one pipe to a top side of the strip of conductive material. The at least one pipe is configured to include cooling fluids in thermal contact with the strip of conductive material.

The foregoing illustrative summary, as well as other exemplary objectives and/or advantages of the disclosure, and the manner in3 which the same are accomplished, are further explained within the following detailed description and its accompanying drawings.

BRIEF DESCRIPTION OF THE DRAWINGS

The components in the drawings are not necessarily to scale relative to each other. Like reference numerals designate corresponding parts throughout the several views.

DETAILED DESCRIPTION

Figure 1A:
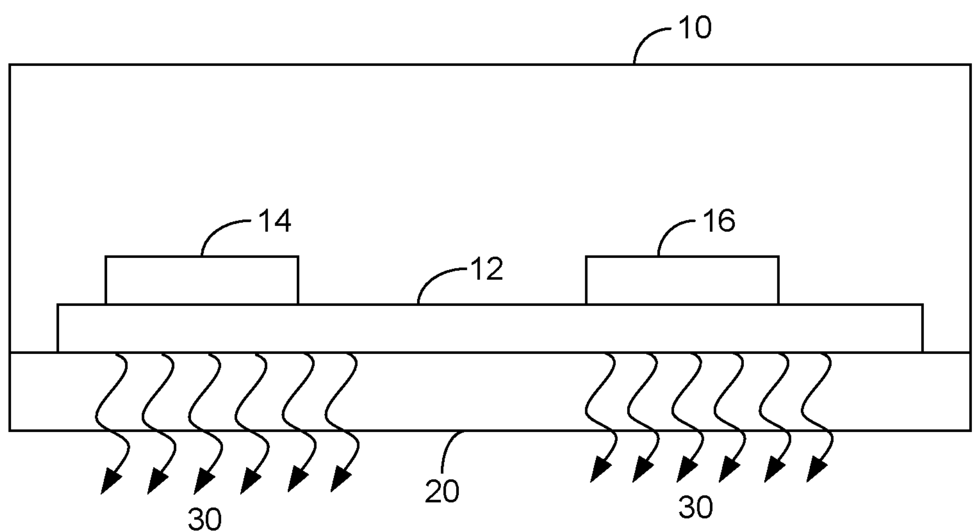
FIG. 1A a schematic illustration of an example power device module package with a cooling mechanism attached to a bottom side of the power device module.

A power device module can include at least one substrate (e.g., a power electronic substrate such as a direct bonded metal (DBM) substrate) on which circuit components and devices (e.g., insulated-gate bipolar transistor (IGBT) power devices, fast recovery diodes (FRDs), silicon carbide metal-oxide-semiconductor field-effect transistors (SiC MOSFETs), metal-oxide high-voltage DC line capacitors, main circuit bus bars, a power device module drive circuit board, a motor control circuit board, three-phase current sensors, and DC and heavy-current AC connectors, etc.) are attached (e.g., soldered). A power device module can be held, i.e., packaged in a casing (housing).

The components and devices may be attached as semiconductor dies (integrated circuit chips) on a top surface of the DBM substrate. The top surface of the DBM substrate may include metal traces and conductive pads to electrically connect the components and devices. For example, a pad on a semiconductor die of a component may be wire bonded to a metal trace on the substrate, which, in turn, may be welded to a lead frame or terminal finger providing an external connection terminal to the package. Pins (e.g., signal pins) may also be attached (e.g., soldered) to the traces on the substrate to provide external connection points to the circuit components and devices.

The package casing (e.g., of a single-side cooling (SSC) power device module) may include a cover portion affixed (e.g., epoxied) to a base portion so that the DBM substrate and the components are contained within a cavity (an interior volume) defined by the base portion and the cover portion. The cover portion of the casing, opposite to the base portion, may include holes through which the pins (soldered signal pins) can extend to the outside of the package to provide exterior connection points to the components and circuitry contained within the casing. The package casing and its cover portion may be made of plastic or polymer materials.

In the SSC power device module, cooling may be achieved by (and limited to) radiation from an outer surface of the DBM substrate. In a dual-side cooling (DSC) power device module, the semiconductor dies (which may be attached to spacer blocks) are disposed between two DBM substrates (e.g., a top DBM substrate and a bottom DBM substrate) in the package casing. In some example implementations, the semiconductor die (which may be attached to a spacer block) may be disposed between the bottom DBM substrate and a conductive strip of material (e.g., a copper clip, an aluminum clip, etc.). In the DSC power device module, cooling may be achieved by, and limited to, radiation emitting from the outer surfaces of the two DBM substrates (or conductive strips of material, e.g., a metal clip).

In some implementations, a heat sink (e.g., a base plate, a pin-fin array, and or a liquid cooling jacket) can help draw away (i.e., dissipate) the heat generated by the power device modules. The heat sink may be attached to, for example, the bottom side of the bottom DBM substrate in an SSC power device module.

Additional cooling structures (cooling mechanisms) for cooling (directly cooling) a side of substrate in a power device module are disclosed herein.

In example implementations, heat-generating components and devices in a package may be cooled via a cooling mechanism coupled, for example, to one side of the substrate (e.g., the top side or the bottom side of the DBM substrate to which the components and devices are attached), in accordance with the principles of the present disclosure.

The term Direct Substrate Side Cooling (DSSC) package is used herein to refer to a power device module package (either an SSC power device module package or a DSC power device module package) that includes power devices that are cooled via a cooling mechanism coupled to one side (outer side) of the substrate(s) on which, or between which, the power devices are disposed (i.e., on the one side of the substrate opposite the side of the substrate to which the power devices are attached).

In example implementations, the cooling mechanism may include a heat sink (e.g., a base plate, a pin-fin array, etc.) and or a liquid cooling jacket. The cooling mechanism when coupled to the bottom of the DBM substrate, for example, in the DSSC package, can provide a heat dissipation path to remove heat from a power device in the package through the bottom of the package.

FIG. 1A is a schematic view an example power device module package 10 including a cooling mechanism attached to a bottom side of a power device module. Power device module package 10 may include a DBM substrate 12 in which power devices (e.g., devices 14 and 16) are disposed. A cooling mechanism 20 is attached to a bottom side 18 of DBM substrate 12. Cooling mechanism 20 may for example, be a metal base plate. As schematically shown in FIG. 1A, heat (e.g., heat 30) generated by the power devices (e.g., devices 14 and 16) can be removed from the package via heat dissipation paths through the cooling mechanism 20.

Figure 1B:
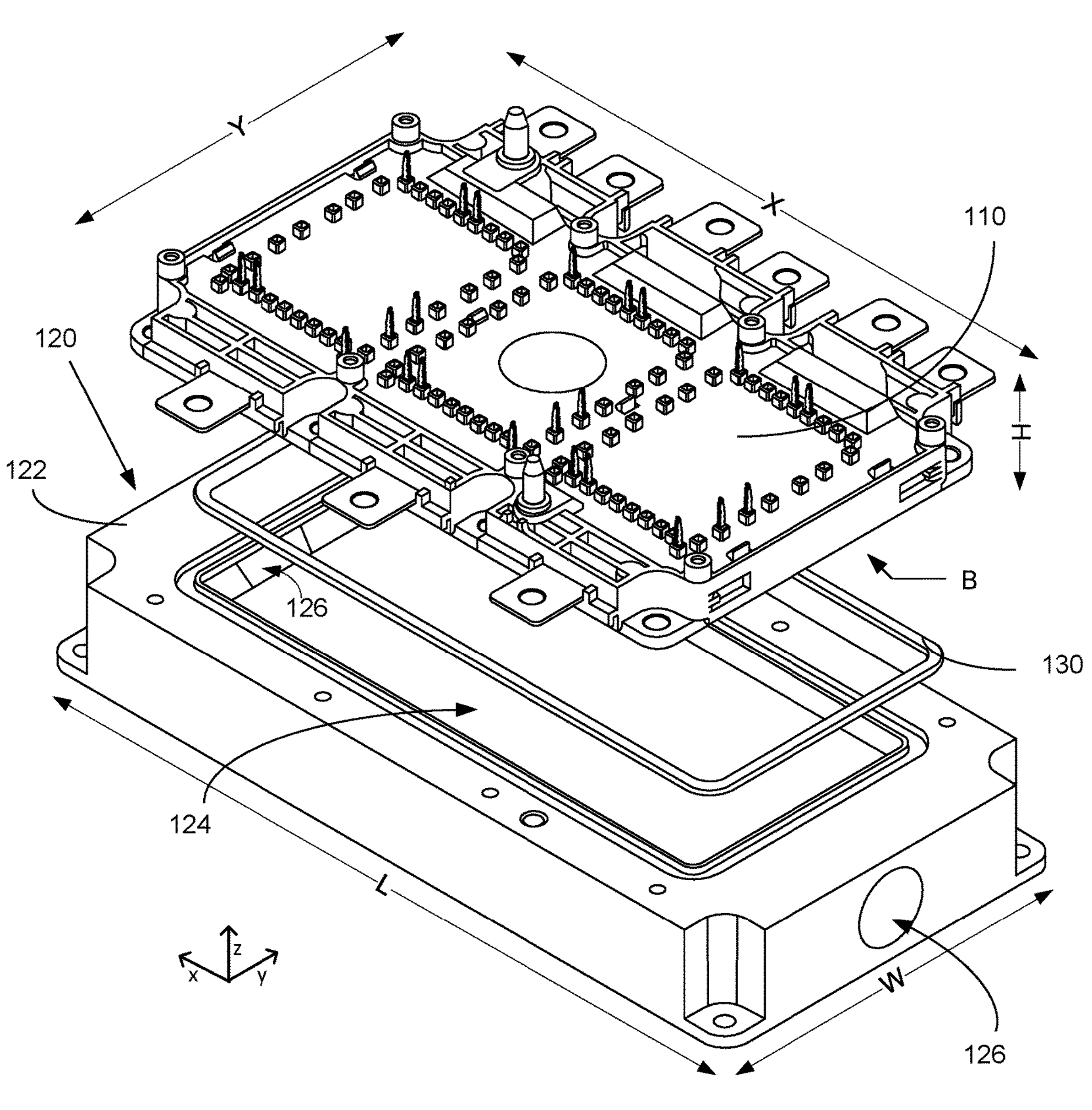
FIG. 1B is an exploded view a power device module package including a cooling mechanism attached to a bottom side of the power device module package.

FIG. 1B is an exploded view a DSSC package 100 including a cooling mechanism 120 attached to a bottom side of power device module. The cooling mechanism provides a heat dissipation path to remove heat from the power device(s) in the package.

DSSC package 100 may, for example, include a package casing 110 enclosing an SSC power device module (not visible) coupled to cooling mechanism 120. The SSC power device module/package casing 110 may have planar dimensions (e.g., rectangular dimensions X and Y) in a x-y plane and a height H along a vertical axis z perpendicular to the x-y plane.

References herein to the vertical geometrical position of features of the power device module/casing (e.g., top side, bottom side, top surface, bottom surface, etc.) can refer to the relative positions of the features along the vertical axis z.

The SSC power device module (only the package casing 110 of which is visible in FIG. 1B) may include power devices mounted on a DMB substrate (not shown) disposed on a bottom side B of the package. Cooling mechanism 120 may include a cooling jacket 122 that includes a cavity (e.g., chamber 124) with, for example, openings 126. Chamber 124 may be configured to hold fluids. A heat-conducting fluid (e.g., water, automotive coolant fluid, etc.) may be recirculated through chamber 124, for example, via openings 126. A fluid recirculation pump (not shown) may be used to recirculate the fluid through opening 126. An elastomeric or rubber O-ring or gasket (e.g., gasket 130) may be used be used to seal cooling jacket 122 against the SSC power device module/package casing 110 so that the heat-conducting fluid (not shown) in chamber 124 is in thermal contact with the DMB substrate (not shown) disposed on the bottom side B of the package casing 110.

In example implementations, cooling mechanism 120 may include a heat sink (e.g., a base plate with a pin-fin array, etc.) coupled to the bottom side of package (not shown in FIG. 1B but discussed later below with reference to FIG. 2).

In example implementations, a DSSC package may also include another cooling mechanism coupled, for example, to a second side of the package (e.g., the top side of the package or a top side of the DBM substrate or a conductive strip of material (e.g., copper clip) attached to the components and devices), in accordance with the principles of the present disclosure.

Figure 2:
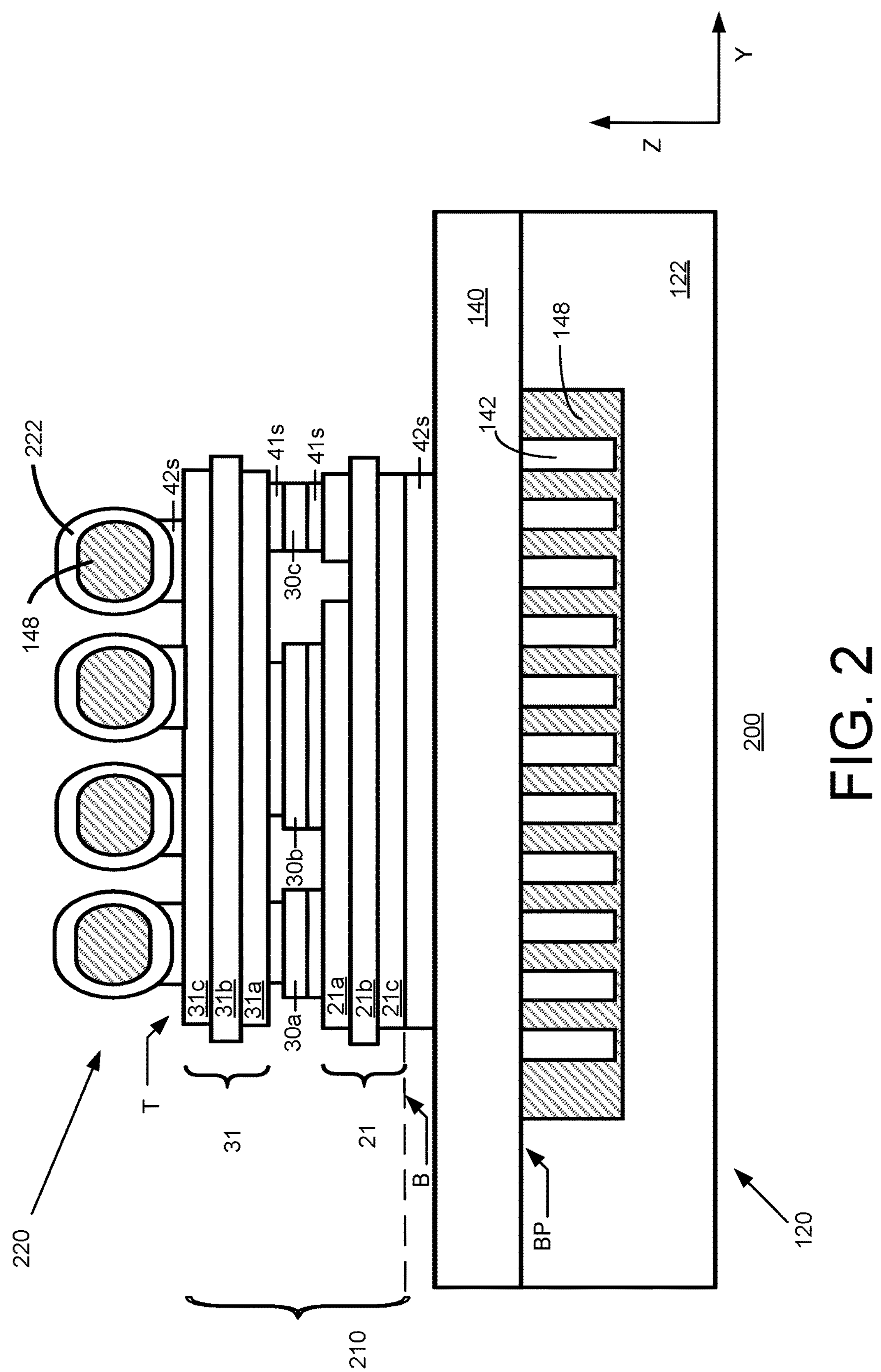
FIG. 2 illustrates a cross sectional view of a direct substrate-side cooling (DSSC) package including a dual-side cooling (DSC) power device module.

FIG. 2 shows a cross sectional view of an DSSC package 200 including a cooling mechanism 220 attached to a top side of the DSSC package.

DSSC package 200 may, for example, include an DSC power device module 210, and a cooling mechanism 220 attached to a top side (e.g., top side T) of DSC power device module 210, in addition to cooling mechanism 120 attached to a bottom side of DSC power device module 210. For visual clarity, a package casing (e.g., a plastic casing) that can be placed over or enclose the DSC power device module 210 is not shown in FIG. 2.

DSC power device module 210 may include, for example, a power device 30*a* (e.g., an IGBT or a SiC MOSFET), a power device 30*b* (e.g., an FRD) and a spacer block 30*c* (e.g., a copper block) disposed between a top DBM substrate (e.g., DBM 31) and a bottom DBM substrate (e.g., DMB 21). The DBM substrates (e.g., DBM 21, DBM 31) may each include an insulating layer (e.g., ceramic layers 21*b*, 31*b*) with a metal layer (e.g., copper layer 21*c*, 21*a*, 31*c*, 31*a*) bonded to each side of the insulating layer. Power device 30*a*, power device 30*b* and spacer block 30*c* that are disposed between the DBM substrates (e.g., DBM 21, DBM 31) may be attached to the DBM substrates using, for example, a sinter (e.g., silver (Ag) sinter) or a solder (e.g., solder 41*s*).

In example implementations, cooling mechanism 220 may include a plurality of cooling pipes (e.g., cooling pipes 222) including (i.e., carrying, holding or flowing) a heat-conducting or cooling fluid (e.g., cooling fluid 148). The plurality of cooling pipes (e.g., cooling pipes 222) may be disposed on a top side (e.g., top side T) of the DSC power device module 210, and attached to a top layer (e.g., copper layer 31*c*) of the top DBM substrate (e.g., DBM 31). The plurality of cooling pipes (e.g., cooling pipes 222) may include any number of cooling pipes (e.g., 2-10 cooling pipes). In the example shown in FIG. 2, the plurality of cooling pipes 222 includes four (4) cooling pipes 222.

Cooling pipes may be made of metal or metal alloy (e.g., copper, aluminum, etc.) and have any cross-sectional shape (e.g., circular, oval, rectangular, etc.). In some example implementations, a cooling pipe may have a circular cross-section with a diameter between about 3 mm and 10 mm. In some implementations, a cooling pipe may have an oval or elliptical cross-section with axes of about 3×4 mm to 10×20 mm.

In example implementations, each of the plurality of cooling pipes 222 may be attached along its length (e.g., length L, FIG. 3A) to copper layer 31*c* using a solder (e.g., solder 42*s*). Recirculating cooling fluid 148 in cooling pipes 222 of cooling mechanism 220 can provide heat dissipation paths for removing heat from the power device(s) in the package through a top of the package.

In example implementations, DSSC package 200 can include additional cooling mechanisms (e.g., cooling mechanism 120, etc.) for removing heat from the power device(s) in the package through a bottom of the package. DSSC package 200 may, for example, include a base plate with a pin-fin array (e.g., base plate 140, pin-fin array 142) coupled to a bottom side B of the DSC power device module 210. Base plate 140 and pin-fin array 142 may be made from a conductive metal or metal alloy (e.g., copper). Base plate 140 may be attached to a bottom layer (e.g., copper layer 21*c*) of the bottom DBM substrate (e.g., DBM 21) using, for example, a solder (e.g., solder 42*s*).

In example implementations, heat generated by the devices in DSSC package 200 may pass through base plate 140 and be removed through pin-fin array 142 into the surrounding environment. In example implementations, cooling jacket 122 (of cooling mechanism 120) may be attached to a bottom BP of base plate 140 so that pin-fin array 142 is immersed in heat-conducting fluid (e.g., cooling fluid 148) in chamber 124 of the cooling jacket. In such implementations, heat generated by the devices in the DSSC package may pass through base plate 140 and be removed through pin-fin array 142 into the heat-conducting fluid (e.g., cooling fluid 148) in chamber 124.

Figure 3A:
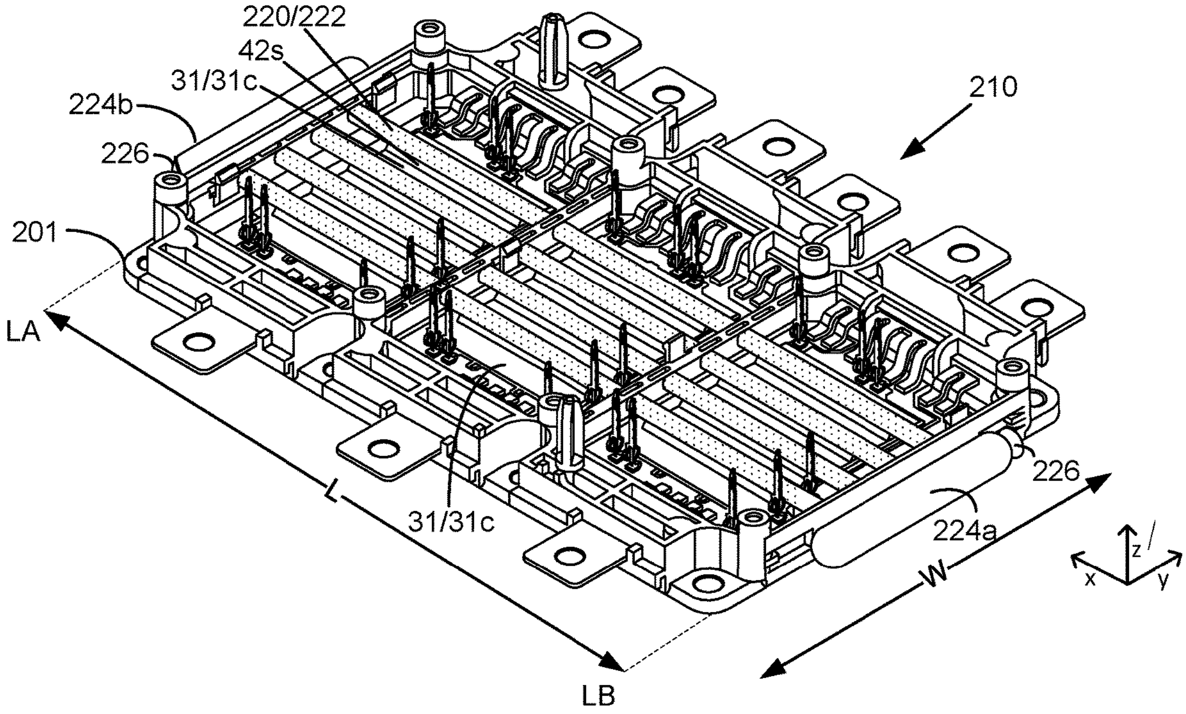
FIG. 3A illustrates a perspective top view of a DSSC package including the DSC power device module of FIG. 2.

FIG. 3A shows a perspective top view of DSC power device module 210 that may be incorporated in, for example, DSSC package 200. In FIG. 3A, DSC power device module 210 is shown as being held in a package casing 201. A top cover (top cover 201C, FIG. 3B) of package casing 201 is removed in the view shown in FIG. 3A to make the plurality of cooling pipes 222 of cooling mechanism 220 in the interior of the package casing visible in FIG. 3A.

As shown in the FIG. 3A, cooling mechanism 220 may include any number of cooling pipes (e.g., cooling pipes 222) (e.g., four cooling pipes) attached of the top DBM substrate (e.g., DBM 31) in DSC power device module 210. Each of the cooling pipes is attached, for example, to top layer 31*c* of DBM substrate 31 by solder 41*s* (as also shown, e.g., in FIG. 2). Each of the cooling pipes may extend across a length L of package casing 201. Each of the cooling pipes may commonly open into, and be in fluid communication with, a connection chamber (e.g., connection chamber 224*a*, connection chamber 224*b*) at each end (LA, LB) of its length L. For example, as shown in FIG. 3A, each of the four the cooling pipes at end LB of the length L opens into connection chamber 224*a* disposed to the right (in the page of the figure) outside of package casing 201, and at the opposite end LA of the length L opens into connection chamber 224*b* disposed to the left (in the page of the figure) outside of package casing 201). In example implementations, connection chamber 224*a* and/or connection chamber 224*b* may include fluid inlet or outlet ports (e.g., connection port 226). A heat-conducting fluid (e.g., cooling fluid 148, water, automotive coolant fluid, etc.) may be recirculated through cooling pipes 222, for example, via the fluid inlet or outlet ports (e.g., connection port 226) on connection chamber 224*a* and connection chamber 224*b*. A fluid recirculation pump (not shown) may be used to recirculate the fluid through cooling pipes 222 via the fluid inlet and outlet ports.

Figure 3B:
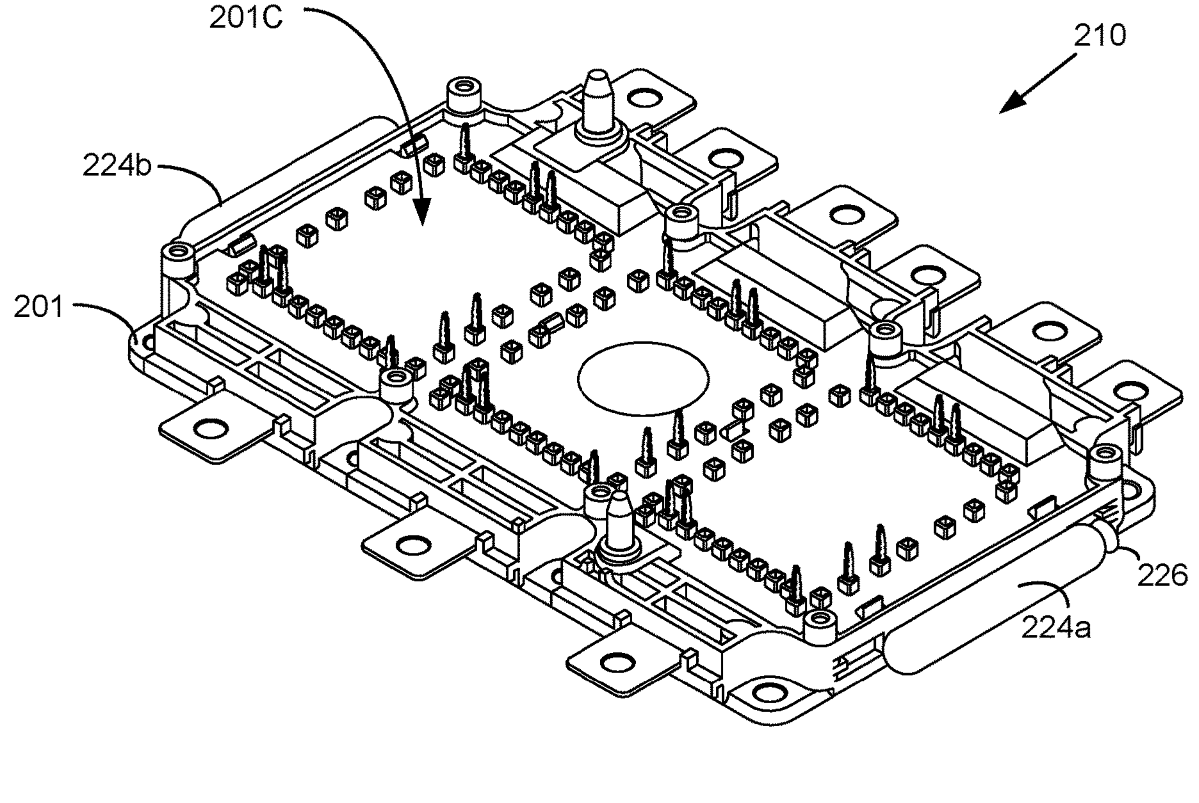
FIG. 3B illustrates a perspective top view of the DSSC package of FIG. 3A.

FIG. 3B shows a perspective top view of DSC power device module 210 with top cover 201C in place on top of package casing 201 obscuring the view of the plurality of cooling pipes 222 of cooling mechanism 220 in the interior of the casing shown in FIG. 3A. In example implementations, a DSSC package may also include another cooling mechanism coupled, for example, to the second side of the package (e.g., the bottom side of the package or a bottom side of the DBM substrate attached to the components and devices), in accordance with the principles of the present disclosure.

Figure 4A:
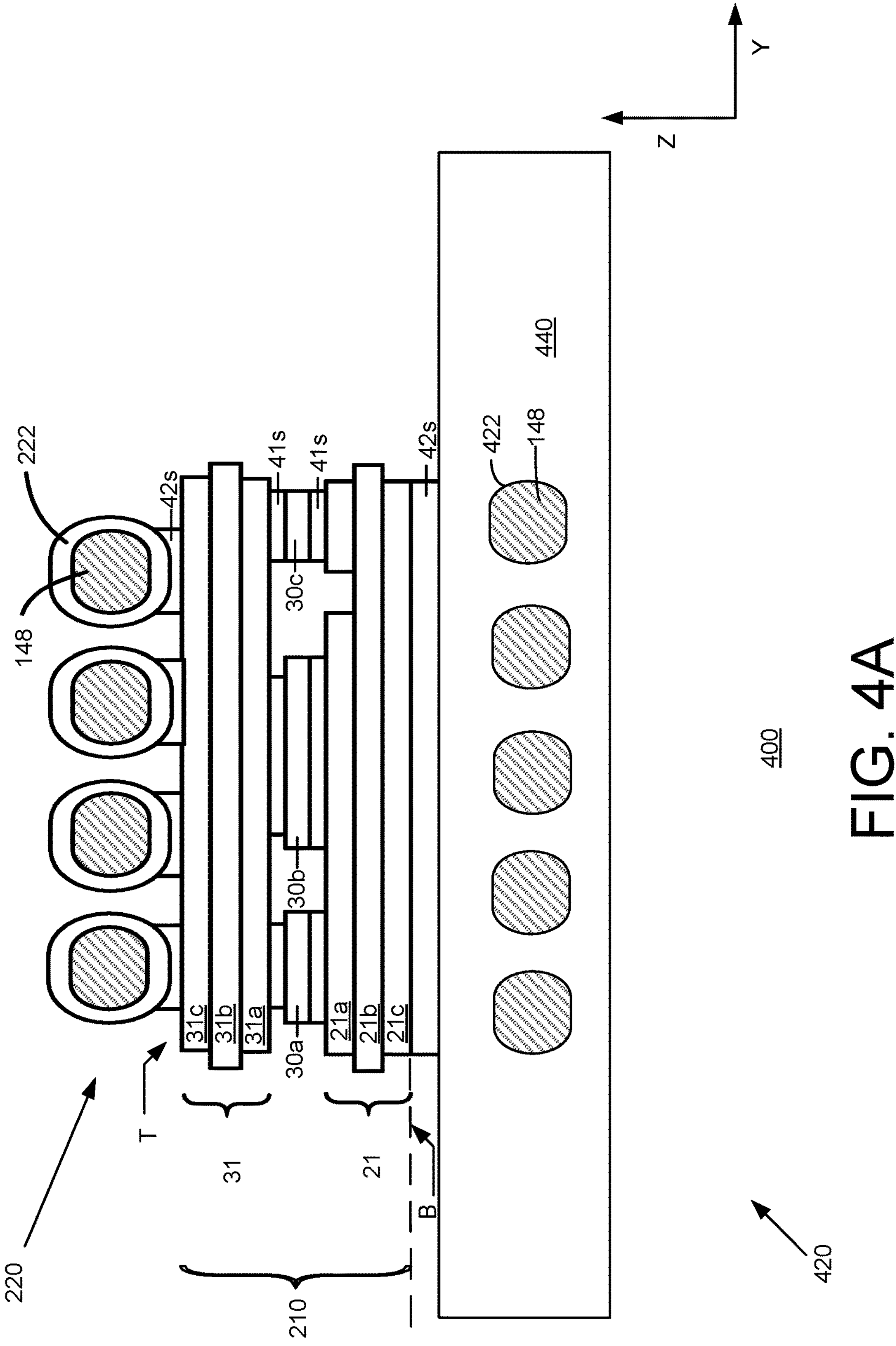
FIG. 4A illustrates a cross sectional view of another DSSC package including the DSC power device module of FIG. 2.

FIG. 4A shows a cross sectional view of a DSSC package 400 including a cooling mechanism 420 attached to a bottom side of a DSC power device module (e.g., DSC power device module 210, FIG. 2). For visual clarity, a package casing (e.g., a plastic casing) that can be placed over or enclose the DSC power device module 210 is not shown in FIG. 4A. DSSC package 400 may, for example, include a DSC power device module (e.g., DSC power device module 210, FIG. 2) and a cooling mechanism 420 attached to a bottom side B of DSC power device module 210 in addition to cooling mechanism 220 attached to a top side T of the DSC power device module.

Cooling mechanism 420 may include a base plate 440 coupled to bottom side B of the power module. Base plate 440 may be made from a conductive metal or metal alloy (e.g., copper, aluminum, etc.). In example implementations, base plate 440 may have a thickness in a range of about 4 mm to 20 mm.

Base plate 440 may be attached to a bottom layer (e.g., copper layer 21*c*) of the bottom DBM substrate (e.g., DBM 21) of the power device module using, for example, a solder (e.g., solder 42*s*). At least one cooling pipe or a plurality of cooling pipes (e.g., cooling pipes 422) may be embedded in base plate 440. Like cooling pipes 222 (FIG. 2), the cooling pipes (e.g., cooling pipes 422) may have any cross-sectional shape (e.g., circular, oval, rectangular, etc.). In some example implementations, a cooling pipe (e.g., cooling pipes 422) may have a circular cross-section with a diameter between about 3 mm to 10 mm. In some implementations, a cooling pipe may have an oval or elliptical cross-section with axes of about 3×4 mm to 10×20 mm.

In example implementations, the plurality of cooling pipes (e.g., cooling pipes 422) may include 1 to 10 cooling pipes (e.g., one cooling pipe, five (5) cooling pipes, etc.) including (i.e., carrying, holding or flowing) heat-conducting or cooling fluid (e.g., cooling fluid 148). Cooling fluid 148 (e.g., water, or an automotive coolant fluid) may be recirculated through the cooling pipes 422 embedded in base plate 440. The recirculating fluid may draw or remove heat generated in DSC power device module 210 through the bottom side of the DSC power device module.

Figure 4B:
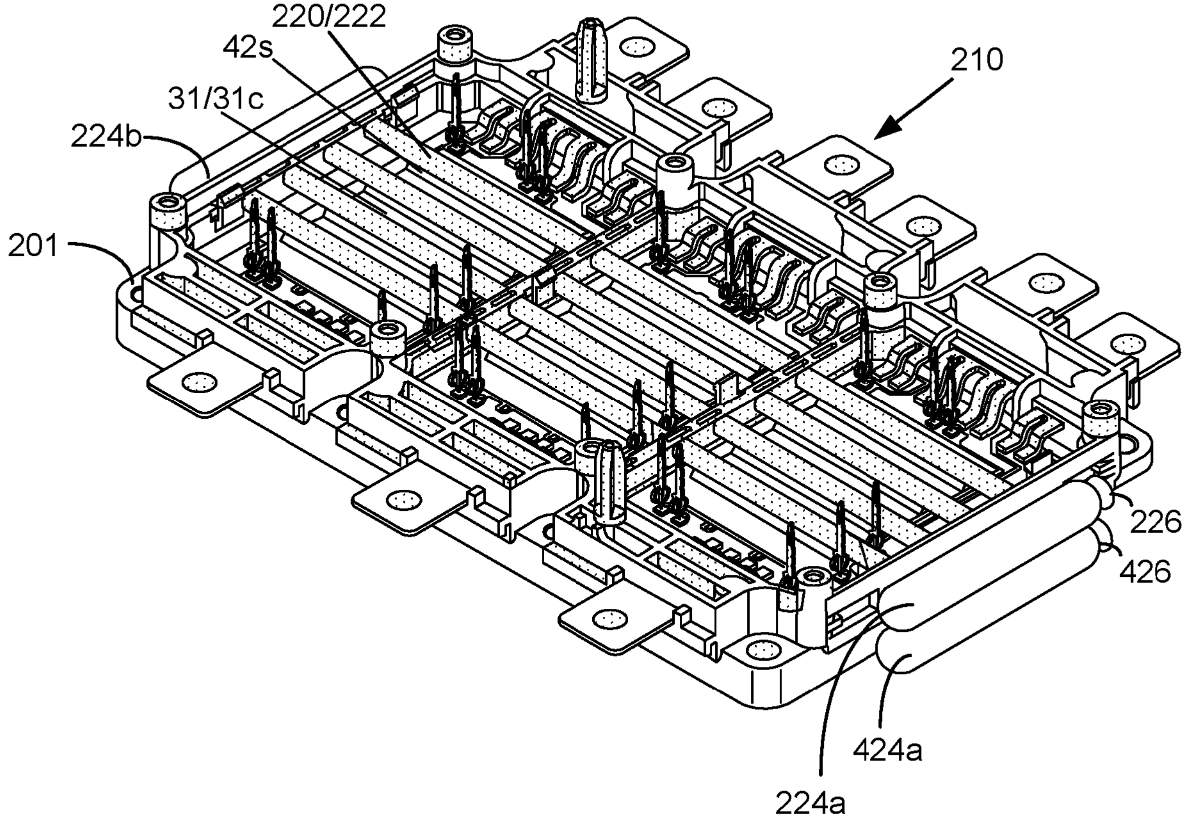
FIG. 4B illustrates a top perspective view of the DSSC package of FIG. 4A with the DSC power device module of FIG. 2. The view shows the DSSC package with a top cover of the package casing removed.

In example implementations, each of the cooling pipes (e.g., cooling pipes 422) may commonly open into, and be in fluid communication with, a connection chamber having a fluid inlet or outlet port (e.g., connection chamber 424*a*, connection port 426, FIG. 4B). A heat-conducting fluid (e.g., cooling fluid 148) (e.g., water, automotive coolant fluid, etc.) may be recirculated through the cooling pipes (e.g., cooling pipes 422) through the fluid inlet and outlet ports (e.g., connection port 426). Heat generated by the devices in DSSC package 400 may pass through base plate 440 and be removed by the recirculating heat-conducting fluid (e.g., cooling fluid 148) in the cooling pipes (e.g., cooling pipes 422).

FIG. 4B shows a perspective top view of DSC power device module 210 that may be incorporated in, for example, DSSC package 400. In FIG. 4B, as in FIG. 3B, in, DSC power device module 210 is shown as being held in a package casing 201. A top cover (e.g., top cover 201C, FIG. 3B) of package casing 201 is removed from the view shown in FIG. 4B to make the plurality of cooling pipes 222 of cooling mechanism 220 in the interior of the casing visible in FIG. 4B. Base plate 440 with its embedded cooling pipes (e.g., cooling pipes 422) of cooling mechanism 420 (FIG. 4A) attached to the bottom of DSC power device module 210 is not visible in the view shown in FIG. 4B. However, connection chamber 424*a* and connection port 426 that are in fluid communication with the embedded pipes (e.g., cooling pipes 422) in base plate 440 are shown to the right of package casing 201 in FIG. 4B.

Figure 4C:
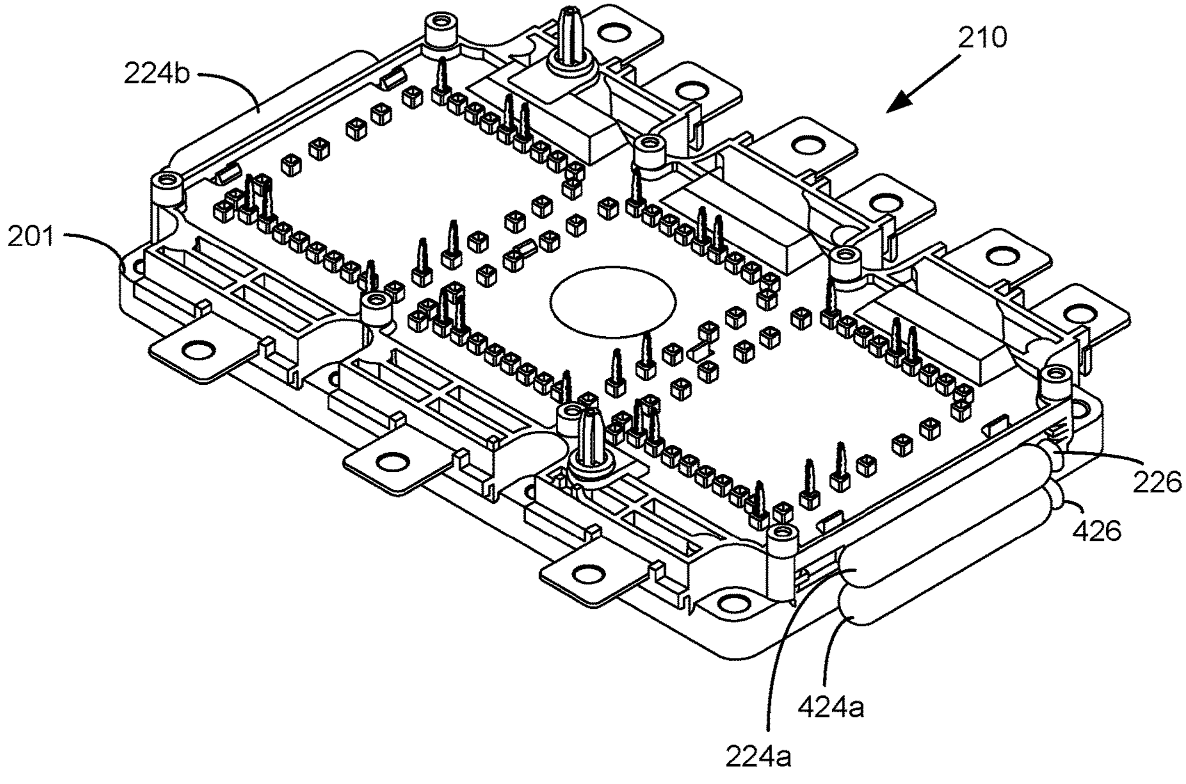
FIG. 4C illustrates another perspective top view of the DSSC package of FIG. 4A with the top cover the package casing in place obscuring the view of the plurality of the cooling pipes shown in FIG. 4B.

FIG. 4C shows a perspective top view of DSC power device module 210 with top cover 201C in place on top of package casing 201 obscuring the view of the plurality of cooling pipes 222 of cooling mechanism 220 in the interior of the casing that are shown in FIG. 4B. The only components of the cooling mechanisms 120 and 420 used in DSSC package 400 that are visible in FIG. 4C are the connection chambers and fluid inlet/outlet ports (i.e., connection chambers 224*a*, 224*b*, 424*a*, and connection ports 226, 426, (FIG. 4B)) used for recirculating cooling fluid through the various cooling pipes (e.g., cooling pipes 222 and cooling pipes 422 (FIG. 4A)).

As noted previously, a power device module (e.g., DSC power device module) may include semiconductor die (which may be attached to a spacer block) disposed between a bottom DBM substrate and a top conductive strip of material (e.g., a copper clip). In example implementations, any of the cooling mechanism described above (e.g., cooling mechanism 120, cooling mechanism 220, etc.) may be used to cool the power device module with semiconductor die disposed between the bottom DBM substrate and the top conductive strip of material (e.g., a copper clip).

Figure 5:
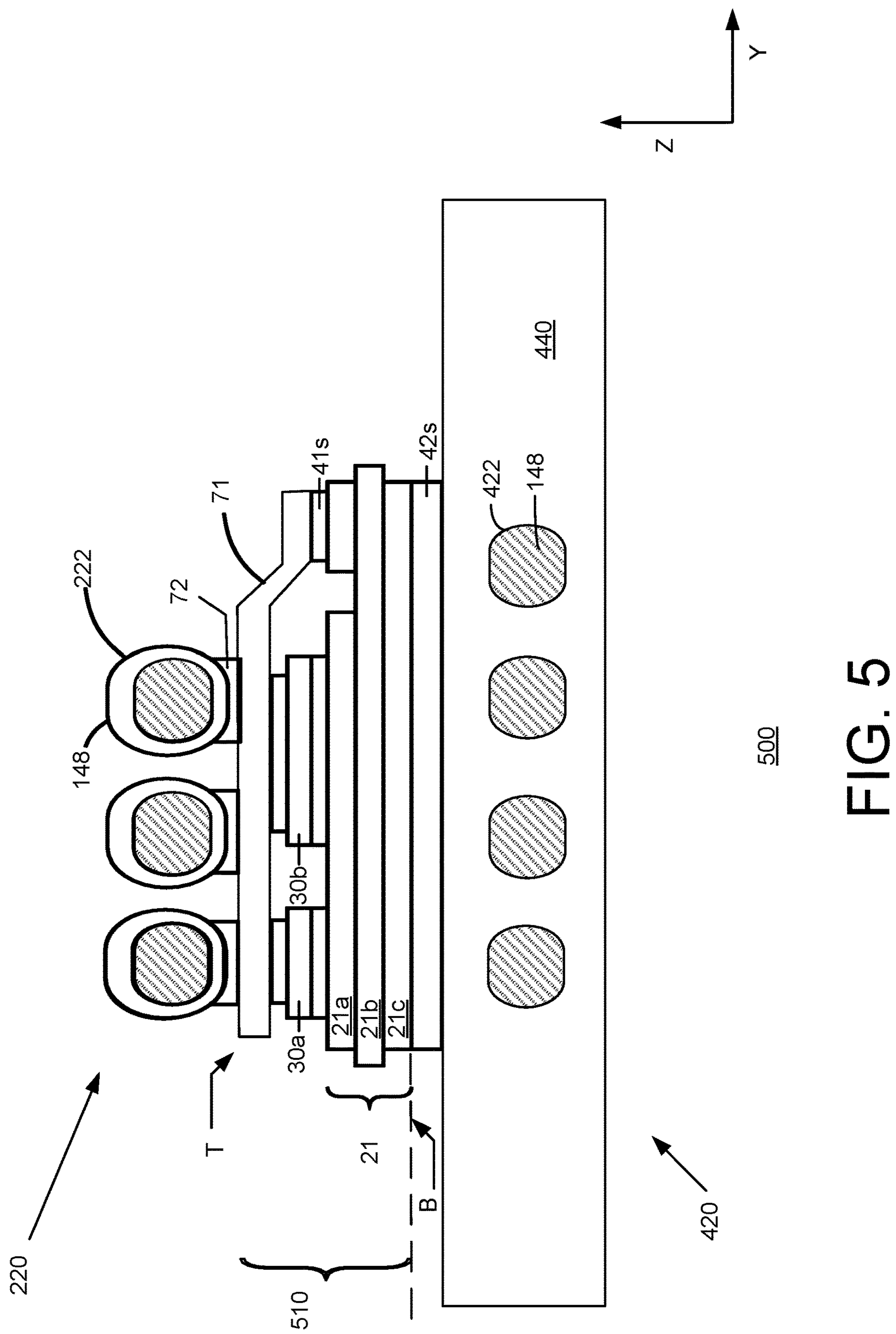
FIG. 5 illustrates a cross sectional view of a DSSC package that includes another DSC power device module.

FIG. 5 shows a cross sectional view of a DSSC package 500 that includes a DSC power device module 510 including semiconductor dies (e.g., power device 30*a* and power device 30*b*) disposed between a bottom DBM substrate (e.g., DMB 21) and a copper clip (e.g., copper clip 71). Either or both cooling mechanism 420 and cooling mechanism 220 may be used to remove heat from DSC power device module 510. For example, base plate 440 of cooling mechanism 420 with at least one embedded pipe (e.g., cooling pipes 422) may be attached to the bottom of DSC power device module 510 to remove heat from the bottom side. Further, at least one cooling pipe (e.g., cooling pipes 222) of cooling mechanism 220 may be attached to a top of the copper clip (e.g., copper clip 71) to remove heat from the top side. In the example shown in FIG. 3, a plurality of cooling pipes 222 attached to the top of copper clip 71 may include three (3) cooling pipes 222. The three cooling pipes may be attached the top of copper clip 71 using an insulating adhesive or compound (e.g., insulator 72).

Heat generated by the devices in the DSSC package may on the bottom side pass through base plate 440 and be removed by the recirculating heat-conducting fluid (e.g., cooling fluid 148) in cooling pipes 422. Further, heat generated by the devices in the DSSC package may on the top side pass through copper clip 71 and be removed by recirculating heat-conducting fluid (e.g., cooling fluid 148) in cooling pipes 222.

Figure 6:
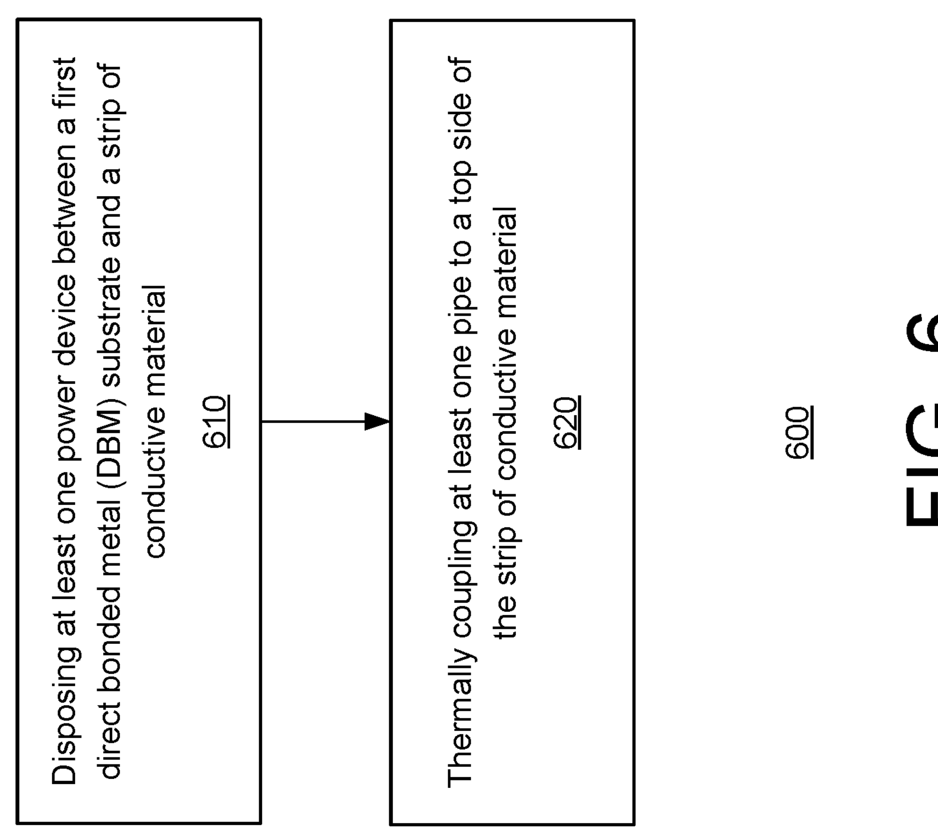
FIG. 6 illustrates an example method for removing heat generated by power devices in a power device module.

FIG. 6 illustrates an example method 600 for removing heat generated by power devices in a power device module.

Method 600 includes disposing at least one power device between a first direct bonded metal (DBM) substrate and a strip of conductive material (610). The strip of conductive material can be one of a second DMB substrate or a metal clip (e.g., a copper clip, an aluminum clip, etc.). The method further includes thermally coupling at least one pipe to a top side of the strip of conductive material (620). The at least one pipe is configured to include (i.e., carry, hold or flow) cooling fluids in thermal contact with the strip of conductive material.

Figure 7:
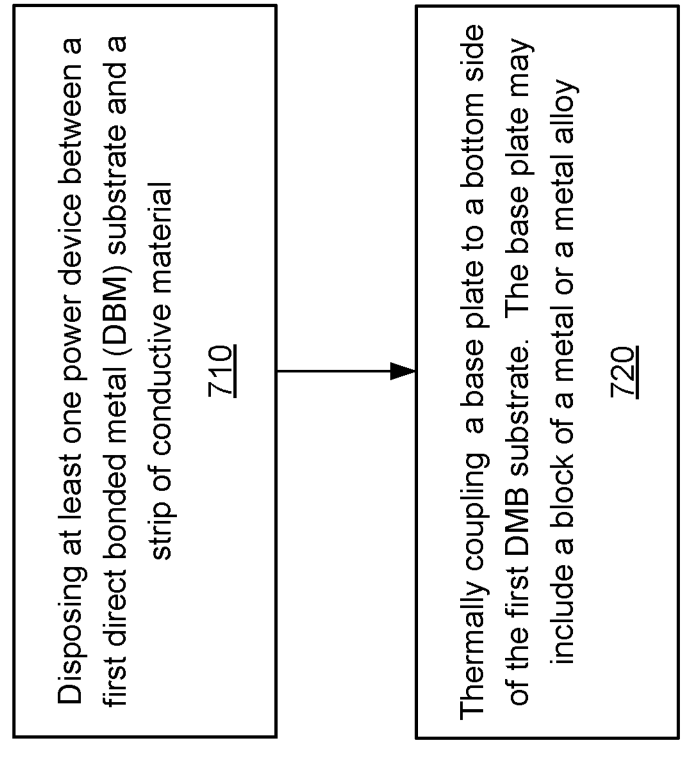
FIG. 7 illustrates another example method for removing heat generated by power devices in a power device module.

FIG. 7 illustrates another example method 700 for removing heat generated by power devices in a power device module.

Method 700 includes disposing at least one power device between a first direct bonded metal (DBM) substrate and a strip of conductive material (710). The strip of conductive material can be one of a second DMB substrate or a metal clip (e.g., a copper clip, an aluminum clip, etc.). Method 700 further includes thermally coupling a base plate to a bottom side of the first DMB substrate (720). The base plate may include a block of a metal or a metal alloy. In some example implementations, the base plate includes at least one embedded pipe configured to include (i.e., carry, hold or flow) a cooling fluid through the base plate. In some example implementations, the base plate includes a pin-fin array, and method 700 further includes disposing the pin-fin array in a liquid holding chamber of a liquid jacket attached to a bottom of the base plate.

In FIG. 1A through FIG. 7, portions described with terms like upper, top, etc. refer to portions that are nearer to the top of the page than portions specified with terms like lower, bottom, etc. Likewise, portions described with terms like left are nearer to the left side of the page than portions described with terms like right. It should be recognized that these descriptions represent a chosen frame of reference that is not intended to be limiting because almost any other frame of reference can be used to describe the portions.

The power device module casings, frames and covers may be fabricated from a first material (i.e., casing material), which can be selected based on properties, such as electrical isolation and compatibility with fabrication (e.g., compatibility with an injection molding process). For example, the casing material can be a thermoplastic polymer, such as polybutylene terephthalate (PBT). PBT may have a first coefficient of thermal expansion (CTE) that is in a range of about 30×10-6 to 100×10-6 per Kelvin (K-1) (i.e., 30-100 ppm/K).

While certain features of the described implementations have been illustrated as described herein, many modifications, substitutions, changes, and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

It will be understood that, in the foregoing description, when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in this specification, a singular form may, unless indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," "the" include plural referents unless the context clearly dictates otherwise. The term "comprising", and variations thereof as used herein is used synonymously with the term "including" and variations thereof and are open, non-limiting terms. The terms "optional" or "optionally" used herein mean that the subsequently described feature, event or circumstance may or may not occur, and that the description includes instances where said feature, event or circumstance occurs and instances where it does not. Ranges may be expressed herein as from "about" one value, and/or to "about" another value. When such a range is expressed, an aspect includes from the one value and/or to the another value. Similarly, when values are expressed as approximations, by use of the antecedent "about," it will be understood that the value forms another aspect. It will be further understood that the endpoints of each of the ranges are significant both in relation to the other endpoint, and independently of the other endpoint.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

The invention claimed is:

1. A package, comprising:

at least one power device disposed between a first direct bonded metal (DBM) substrate and a second DBM substrate;

a plurality of pipes, including a first pipe and a second pipe, thermally coupled to a top side of the first DBM substrate opposite a side of the first DBM substrate with the at least one power device, the plurality of pipes configured to include a cooling fluid therein; and a package casing, the first DBM substrate and the second DBM substrate being disposed within an interior cavity of the package casing, the first pipe and the second pipe being at least partially disposed within the interior cavity, wherein respective ends of the first pipe and the second pipe extend through a wall of the interior cavity to an exterior of the package casing.

2. The package of claim 1, further comprising:

a connection chamber in fluid communication with the plurality of pipes, the connection chamber having at least one fluid inlet or fluid outlet port.

3. The package of claim 1, wherein the first pipe is attached to the top side of the first DBM substrate along a length of the first pipe via a first solder joint, and wherein the second pipe is attached to the top side of the first DBM substrate along a length of the second pipe via a second solder joint, and the first solder joint is separate from the second solder joint.

4. The package of claim 1, wherein the at least one power device includes at least one of an insulated-gate bipolar transistor (IGBT), a fast recovery diode (FRD), and a silicon carbide metal-oxide-semiconductor field-effect transistor (SiC MOSFET).

5. The package of claim 1, further comprising:

a base plate thermally coupled to a bottom side of the second DBM substrate.

6. The package of claim 5, wherein the base plate includes at least one embedded pipe configured to include a cooling fluid through the base plate.

7. The package of claim 6, further comprising:

a connection chamber in fluid communication with the at least one embedded pipe, the connection chamber having at least one fluid inlet or fluid outlet port.

8. The package of claim 5, wherein the base plate further comprises a pin-fin array.

9. The package of claim 8, further comprising:

a cooling jacket including a chamber configured to hold fluids, the cooling jacket being attached to a bottom of the base plate, so the pin-fin array is disposed in the chamber configured to hold fluids.

10. The package of claim 1 further comprising:

a first connection chamber exterior to the package casing, wherein a first end of the first pipe and a first end of the second pipe are connected to the first connection chamber; and a second connection chamber exterior to the package casing on a side of the package casing opposite to the first connection chamber, wherein a second end of the first pipe and a second end of the second pipe are connected to the second connection chamber.

11. A power device module, comprising:

at least one power device disposed between a direct bonded metal (DBM) substrate and a conductive strip of material; and a plurality of pipes, including a first pipe and a second pipe, thermally coupled to a top side of the conductive strip of material, the plurality of pipes configured to include a cooling fluid; and a package casing, the first DBM substrate and the conductive strip being disposed within an interior cavity of the package casing, the first pipe and the second pipe being at least partially disposed within the interior cavity, wherein respective ends of the first pipe and the second pipe extend through a wall of the interior cavity to an exterior of the package casing.

12. The power device module of claim 11, wherein the conductive strip of material is a copper clip or an aluminum clip.

13. The power device module of claim 11, further comprising:

a connection chamber in fluid communication with the plurality of pipes, the connection chamber having at least one fluid inlet and one fluid outlet port.

14. The power device module of claim 11, wherein the first pipe and the second pipe are independently attached to the top side of the conductive strip of material using an insulating adhesive or compound.

15. The power device module of claim 11, further comprising:

a base plate thermally coupled to a bottom side of the DBM substrate, the base plate including at least one embedded pipe configured to include a cooling fluid through the base plate.

16. The power device module of claim 15, further comprising:

a connection chamber in fluid communication with the at least one embedded pipe, the connection chamber having at least one fluid inlet or fluid outlet port.

17. A method comprising:

disposing at least one power device between a first direct bonded metal (DBM) substrate and a strip of conductive material in an interior cavity of a package casing; and thermally coupling a plurality of pipes including a first pipe and a second pipe to a top side of the strip of conductive material, the plurality of pipes configured to include cooling fluids in thermal contact with the strip of conductive material, the first pipe and the second pipe being at least partially disposed within the interior cavity, wherein respective ends of the first pipe and the second pipe extend through a wall of the interior cavity to an exterior of the package casing.

18. The method of claim 17, wherein the strip of conductive material is a second DMB substrate or a metal clip.

19. A method comprising:

disposing at least one power device between a first direct bonded metal (DBM) substrate and a second DMB substrate in an interior cavity of a package casing;

thermally coupling a plurality of pipes including a first pipe and a second pipe to a top side of the first DBM substrate, the plurality of pipes configured to include cooling fluids in thermal contact with the first DBM substrate, the first pipe and the second pipe being at least partially disposed within the interior cavity, wherein respective ends of the first pipe and the second pipe extend through a wall of the interior cavity to an exterior of the package casing; and thermally coupling a base plate to a bottom side of the second DMB substrate.

20. The method of claim 19, wherein the base plate includes at least one embedded pipe configured to carry a cooling fluid through the base plate.

21. The method of claim 19, wherein the base plate includes a pin-fin array, and the method further comprises disposing the pin-fin array in a liquid holding chamber of a liquid jacket attached to a bottom of the base plate.

* * * * *